(12) United States Patent
Liu et al.

(10) Patent No.: US 6,468,873 B1
(45) Date of Patent: Oct. 22, 2002

(54) MIM FORMATION METHOD ON CU DAMSCENE

(75) Inventors: Chung-Shi Liu, Hsin-chu; Shau-Lin Shue, Hsinchu, both of (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/004,480

(22) Filed: Nov. 1, 2001

(51) Int. Cl.[7] .......................... H01L 21/20; H01L 21/00
(52) U.S. Cl. ...................... 438/387; 438/243; 438/244; 438/397; 257/532
(58) Field of Search ................................ 438/386, 387, 438/399, 396, 532, 243, 244; 257/532, 243, 244, 253, 236

(56) References Cited

U.S. PATENT DOCUMENTS 6,136,682 A * 10/2000 Hegde et al. .......... 204/192.15
6,368,948 B1 * 4/2002 Ngo et al. .............. 438/584

* cited by examiner

Primary Examiner—Olik Chaudhuri
Assistant Examiner—Timothy Sutton
(74) Attorney, Agent, or Firm—Tung & Associates

(57) ABSTRACT

A method and apparatus for forming a metal-insulator-metal structure on a copper damascene, including a semiconductor device thereof. A copper layer may be initially deposited upon a substrate to form a copper damascene, wherein the copper layer forms a metal layer of a metal-insulator-structure. A barrier layer may then be formed upon the substrate following deposition of the copper layer upon the substrate. Thereafter, the copper layer can be polished utilizing chemical mechanical polishing (CMP) to provide enhanced uniformity of the copper layer, thereby producing a well-controlled metal-insulator-metal structure upon the substrate. The barrier layer formed upon the substrate following deposition of the copper layer may be configured as an in-situ metal barrier. Such an in-situ metal barrier layer may be formed, for example, from tantalum nitride (TaN). The barrier layer may alternatively be configured as a dielectric barrier configured, for example, from $NH_3$ plasma in combination with SiN.

10 Claims, 5 Drawing Sheets

MIM FORMATION METHOD ON CU DAMSCENE

TECHNICAL FIELD

The present invention relates generally to semiconductor devices and manufacturing methods and systems thereof. More specifically, the present invention relates to metal-insulator-metal (MIM) structures and methods for forming such MIM structures. The present invention also relates to techniques for forming MIM structures in association with a damascene metal, such as copper.

BACKGROUND OF THE INVENTION

Recent efforts in miniaturizing ICs have focused on reducing the space consumed by the circuit components. The ongoing evolution in miniaturizing IC components has resulted in reduced costs and more circuit functionality for a given substrate size and manufacturing cost. For example, only a few years ago spacing between adjoining circuit elements in a typical IC was in the neighborhood of two to three microns. Today, many ICs are being designed at spacing distances as small as 0.35 microns or less. To accommodate narrower spacing, the electrical conductors are reduced in width. Increasing the thickness of the conductors to avoid degrading the quality of the signal conducted compensates for the reduction in width.

Increasing the thickness of the conductors also requires increases in the thickness of the dielectric insulation material, which separates and covers the conductors and components. The thickness of the dielectric must be greater than the height or topology difference among the components, to provide adequate insulation to separate the layers and components of the IC structure from one another. Increases in the thickness of the dielectric material are possible, in part, as a result of advanced planarization techniques such as chemical mechanical polishing (CMP). CMP smooths relatively significant variations in the height of the different components to a planar surface. Smoothing the variable-height topology to a planar surface allows the typical lithographic semiconductor fabrication techniques to be used to form considerably more layers than were previously possible in IC construction.

Excess conductive material on the surface of the dielectric layer can be typically removed by chemical mechanical polishing. One such method is known as damascene and basically involves forming an opening in the dielectric interlayer and filling the opening with a metal. Dual damascene techniques, for example, involve forming an opening comprising a lower contact or via hole section in communication with an upper trench section, which opening is filled with a conductive material, typically a metal, to simultaneously form a conductive plug and electrical contact with a conductive line.

In the semiconductor industry, ASIC memories have gained enormous popularity in integrated circuits (ICs) designs. ASICs allow custom or semi custom designs of ICs in shorter turn-around time while reducing the total component count and manufacturing costs. ASICs employ libraries of "standard cells" as building blocks to construct the desired logic circuits. Standard cells include commonly used programmable logic arrays, decoders, registers, counters, and other conventional circuits or components.

An ASIC chip contains single or multiple configurable memory arrays with row memory lines intersecting column memory lines. A plurality of column memory lines can be grouped together to form an I/O (input/output) memory block. In such instance, the memory array contains row memory lines intersecting I/O memory blocks. Each intersecting point between a row memory line and an I/O memory block represents one memory cell which stores a binary digit of logic "0" or "1". The collection of these memory cells forms a memory array, which serves as a principle building block for implementing a custom or semi custom ASIC chip.

Because ASICs provide a truly cost-effective way of implementing a large number of digital logic circuits to perform a particular function, ASIC designers and IC fabricators have developed certain techniques for reducing the difficulty, expense and time required to design and debug an ASIC, and to manufacture the ASIC in quantity. Because experience has established that ASICs are cost-effective, the number of circuits included in and the complexity of ASIC designs increases year by year. Obviously, increasing ASIC complexity increases the likelihood of design errors in engineering prototypes, and also increases the number of iterations required to obtain a design that is commercially practical. Moreover, not only are ASIC designs becoming ever more complex, ASIC fabrication techniques are also advancing year by year.

MIM (Metal-Insulator Metal) structures have been widely used with ASIC products. MIM (Metal-Insulator-Metal) capacitors, for example, can be formed from a configuration in which a dielectric material is sandwiched between two metal electrodes. Known MIM devices, generally comprising a thin film insulating layer sandwiched between two conductive layers across which in use a voltage is applied, can be regarded as a kind of diode structure in that they exhibit a non-linear resistive characteristic and have been used in active matrix addressed liquid crystal display devices as switching elements in the addressing of the display device's picture elements. MIM structures are thus well known in the art.

Copper metallization of chips has thus been the subject of intense investigation for a number of years. Techniques for integrating MIM structures into copper damascene fabrication-based processes are essential for achieving widths in semiconductor processes of 0.13 um and beyond. One of the primary problems, however, in utilizing copper damascene fabrication-based techniques in association with the formation of MIM structures lies in the inability to avoid copper oxidation following a copper deposition and subsequent chemical mechanical polishing operations (CMP). Additionally, it is difficult using present fabrication techniques to achieve a uniform dielectric layer formed on metal layers of a MIM structure. The present inventors have thus concluded, based on the foregoing, that a need exists for a new semiconductor fabrication technique, including semiconductor devices thereof, which would produce a much more uniform dielectric layer in association with MIM structures, while simultaneously avoiding associated copper oxidation problems.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor chip and associated circuitry thereof.

It is another aspect of the present invention to provide an improved MIM structure and formation methods thereof.

It is yet another aspect of the present invention to provide an improved MIM structure and methods for forming such a MIM structure into a copper damascene.

It is still another aspect of the present invention to provide improved MIM fabrication methods and devices thereof, which avoids copper oxidation problems.

It is another aspect of the present invention to provide improved MIM structure methods and devices thereof, which possesses highly uniform dielectric layers.

The above and other aspects of the present invention can be achieved as is now described. A method and apparatus for forming a metal-insulator-metal structure on a copper damascene, including a semiconductor device thereof, are disclosed herein. A copper layer may be initially deposited upon a substrate to form a copper damascene, wherein the copper layer forms a metal layer of a metal-insulator-structure. A barrier layer may then be formed upon the substrate following deposition of the copper layer upon the substrate. Thereafter, the copper layer can be polished utilizing chemical mechanical polishing (CMP) to provide enhanced uniformity of the copper layer, thereby producing a well-controlled metal-insulator-metal structure upon the substrate. The barrier layer formed upon the substrate following deposition of the copper layer may be configured as an in-situ metal barrier. Such an in-situ metal barrier layer may be formed, for example, from tantalum nitride (TaN). The barrier layer may alternatively be configured as a dielectric barrier configured, for example, from NH$_3$ plasma in combination with SiN. The method and apparatus, including a semiconductor device thereof, permit the avoidance of copper oxidation following copper deposition and chemical mechanical polishing (CMP) of the copper layer. Additionally, as a result of implementing the method and apparatus described herein, a much more uniform dielectric layer can be formed on a first metal layer of a MIM, thereby resulting in a well-controlled MIM structure.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
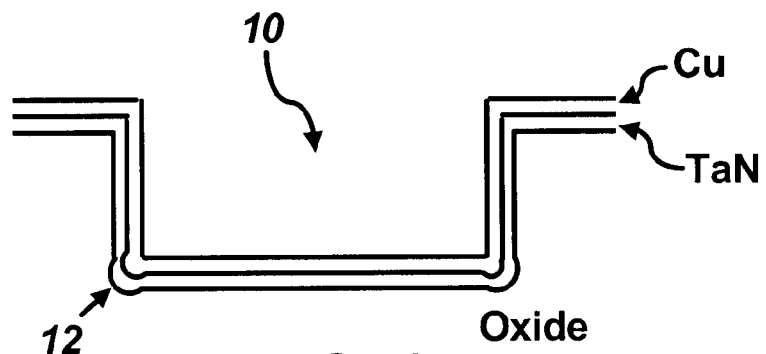
FIG. 1 illustrates a first processing step of a prior art semiconductor deposition configuration.
Figure 2:
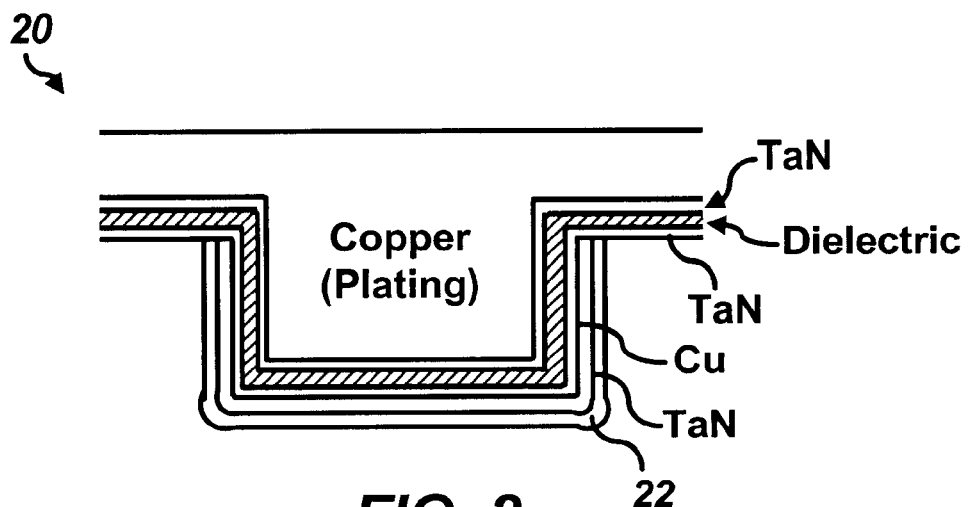
FIG. 2 depicts a second processing step of a prior art semiconductor deposition configuration.
Figure 3:
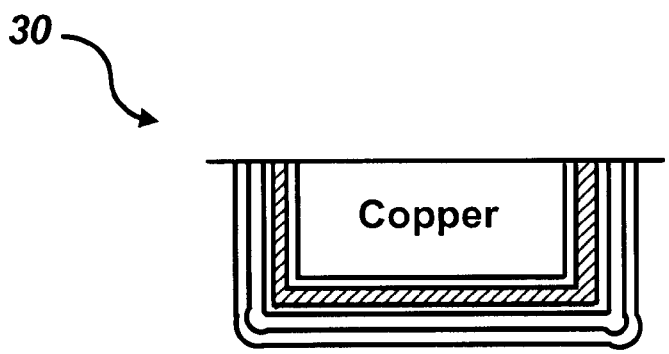
FIG. 3 illustrates a third processing step of a prior art semiconductor deposition configuration.

FIG. 1 illustrates a first processing step of a prior art semiconductor deposition configuration 10. FIGS. 1 to 3 generally illustrate prior art semiconductor processing steps that result in copper oxidation following copper deposition and chemical mechanical polishing (CMP). Implementing the prior art semiconductor processing steps depicted in FIGS. 1 to 3 generally results in poor MIM structures. FIGS. 1 to 3 illustrate a semiconductor formation process in which a CMP operation is followed by the formation of a tantalum nitride (TaN) layer, which in turn is generally followed by the formation of a dielectric layer. Following the formation of the dielectric layer, as illustrated in semiconductor deposition configuration 20 of FIG. 2, a subsequent TaN layer is deposited. Layer 22, in particular, can form an electrode/diffusion barrier. The result, as indicated in semiconductor configuration 30 of FIG. 3 is that CMP operations are generally difficult.

Figure 4:
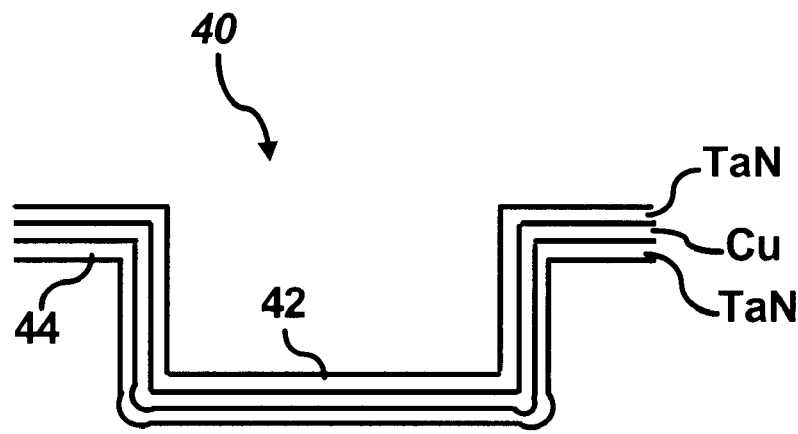
FIG. 4 depicts a semiconductor deposition configuration in which an in-situ metal barrier layer is formed, in accordance with a preferred embodiment of the present invention.
Figure 5:
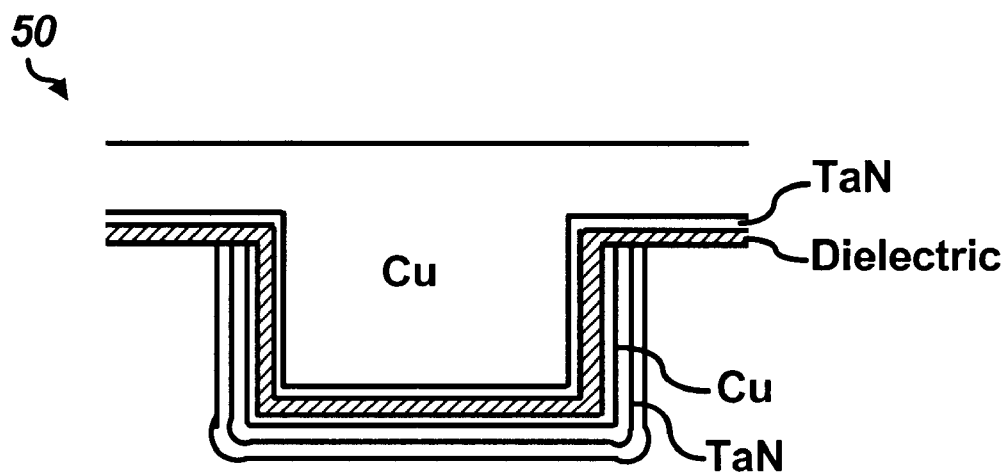
FIG. 5 illustrates a semiconductor deposition configuration in which chemical mechanical polishing may occur, in accordance with a preferred embodiment of the present invention.
Figure 6:
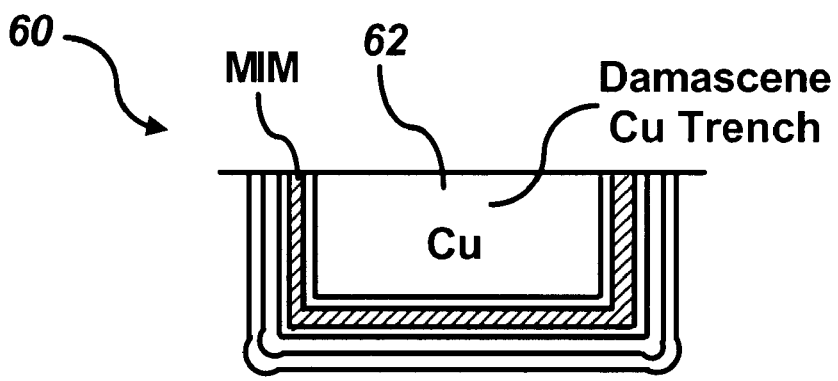
FIG. 6 depicts a semiconductor deposition configuration illustrating a MIM and a damascene copper trench, in accordance with a preferred embodiment of the present invention.

FIG. 4 depicts a semiconductor deposition configuration 40 in which an in-situ metal barrier layer is formed, in accordance with a preferred embodiment of the present invention. FIG. 5 illustrates a semiconductor deposition configuration 50 in which chemical mechanical polishing may occur, in accordance with a preferred embodiment of the present invention. FIG. 6 depicts a semiconductor deposition configuration 60 illustrating a MIM and a damascene copper trench, in accordance with a preferred embodiment of the present invention. FIGS. 4 to 6 thus together respectively represent first, second and third processing operations that can be implemented to form a MIM structure utilizing a damascene metal, such as copper. FIG. 4 thus depicts the formation of several layers, including a first TaN layer followed by a copper (Cu) layer, which in turn is followed by a second TaN layer. The second TaN layer 42 protects the copper layer, which lies immediately beneath layer 42 from oxidation. FIG. 5 depicts a layering deposition operation that occurs after the layer deposition operation illustrated in FIG. 4. As indicated in FIG. 5, a dielectric layer is formed beneath a TaN layer, which in turn permits CMP operations to be performed in a much more efficient manner than the configurations illustrated in FIGS. 1 to 3. Lastly, FIG. 6 illustrates the final step in the formation of an MIM structure. An MIM is indicated in FIG. 6, along with a damascene copper trench 62.

Figure 7:
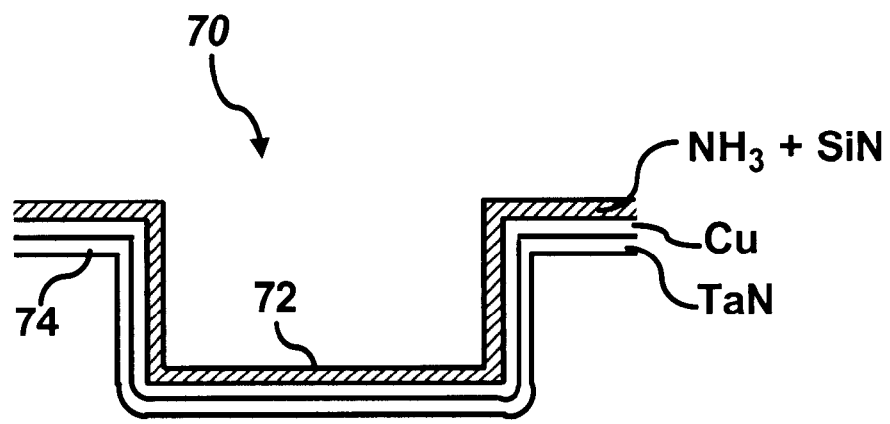
FIG. 7 illustrates a semiconductor deposition configuration in which a plasma is utilized, in accordance with an alternative preferred embodiment of the present invention.
Figure 8:
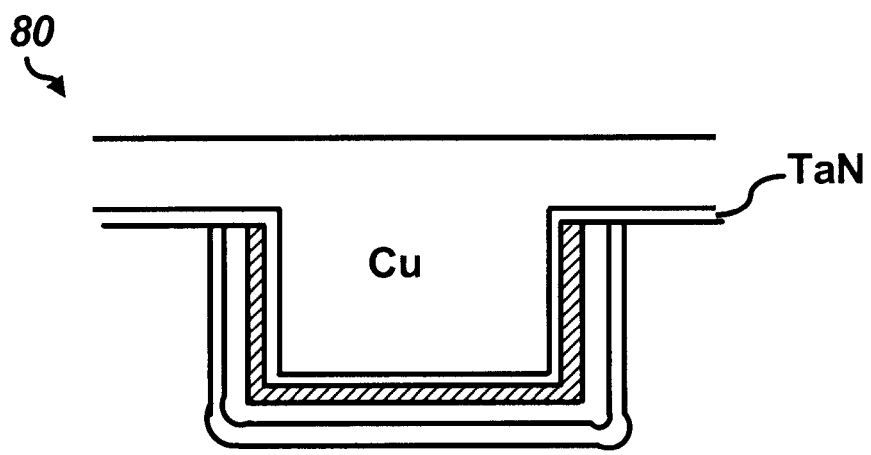
FIG. 8 depicts a semiconductor deposition configuration in which a tantalum nitride (TaN) layer is deposited in accordance with an alternative preferred embodiment of the present invention.
Figure 9:
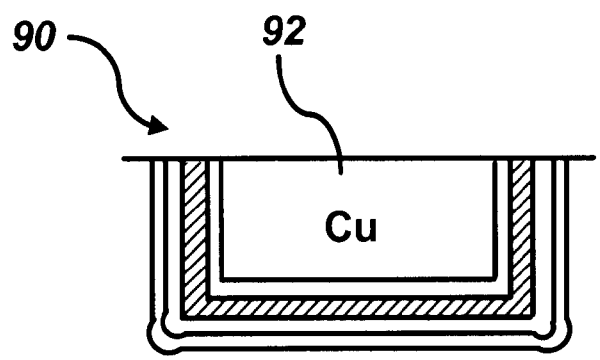
FIG. 9 illustrates a semiconductor deposition configuration in which a final chemical polishing operation may be implemented, in accordance with an alternative preferred embodiment of the present invention.

FIG. 7 illustrates a semiconductor deposition configuration 70 in which a plasma is utilized, in accordance with an alternative preferred embodiment of the present invention. FIG. 8 depicts a semiconductor deposition configuration 80 in which a tantalum nitride (TaN) layer is deposited in accordance with an alternative preferred embodiment of the present invention. FIG. 9 illustrates a semiconductor deposition configuration 90 in which a final chemical polishing operation may be implemented, in accordance with an alternative preferred embodiment of the present invention. FIGS. 7 to 9 together thus represent an alternative MIM formation embodiment of the present invention. As indicated in FIG. 7, a TaN layer is formed which lies beneath a copper layer. The copper layer is formed above the initial TaN layer 74. A layer 72 treated with $NH_3$ plasma and SiN is then formed above the copper layer. Thus, as illustrated in FIG. 7, the copper layer lies between the initial TaN layer 74 and the layer 72. Thereafter, as depicted in FIG. 8, a CMP operation may be performed, which thereafter results in the configuration depicted in FIG. 9, in which a damascene copper trench 92 is formed.

Figure 10:
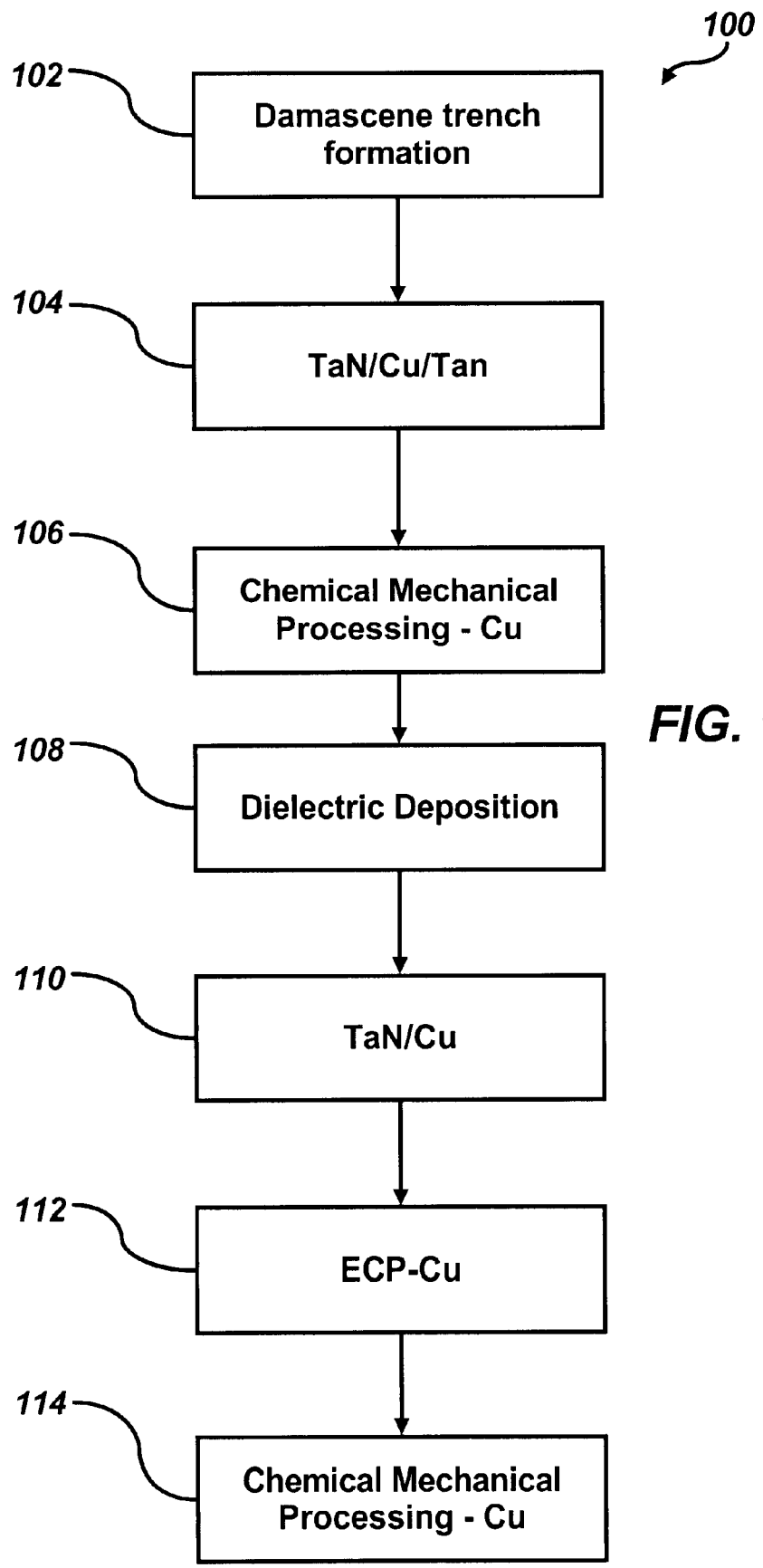
FIG. 10 depicts a flow chart of operations illustrating semiconductor fabrication operations that may be followed to form a MIM device on a copper damascene, in accordance with a preferred embodiment of the present invention.

FIG. 10 depicts a flow chart 100 of operations illustrating semiconductor fabrication operations that may be followed to form a MIM device on a copper damascene, in accordance with a preferred embodiment of the present invention. Initially, as indicated at block 102, a damascene trench formation can be configured upon a substrate followed, as illustrated at block 104 by the formation of a first TaN layer, a copper layer above the first TaN layer, and a second TaN layer above the copper layer. As indicated thereafter at block 106, a CMP operation is performed, followed next, as depicted at block 108, by the deposition of a dielectric layer. Then, as illustrated at block 110, a subsequent TaN layer can be deposited followed by a subsequent copper layer. Thereafter, as depicted at block 112, an electrochemical plating (ECP) operation can be performed upon the copper layer, which was previously deposited (i.e. see block 110). Finally, a subsequent CMP operation can be performed.

Figure 11:
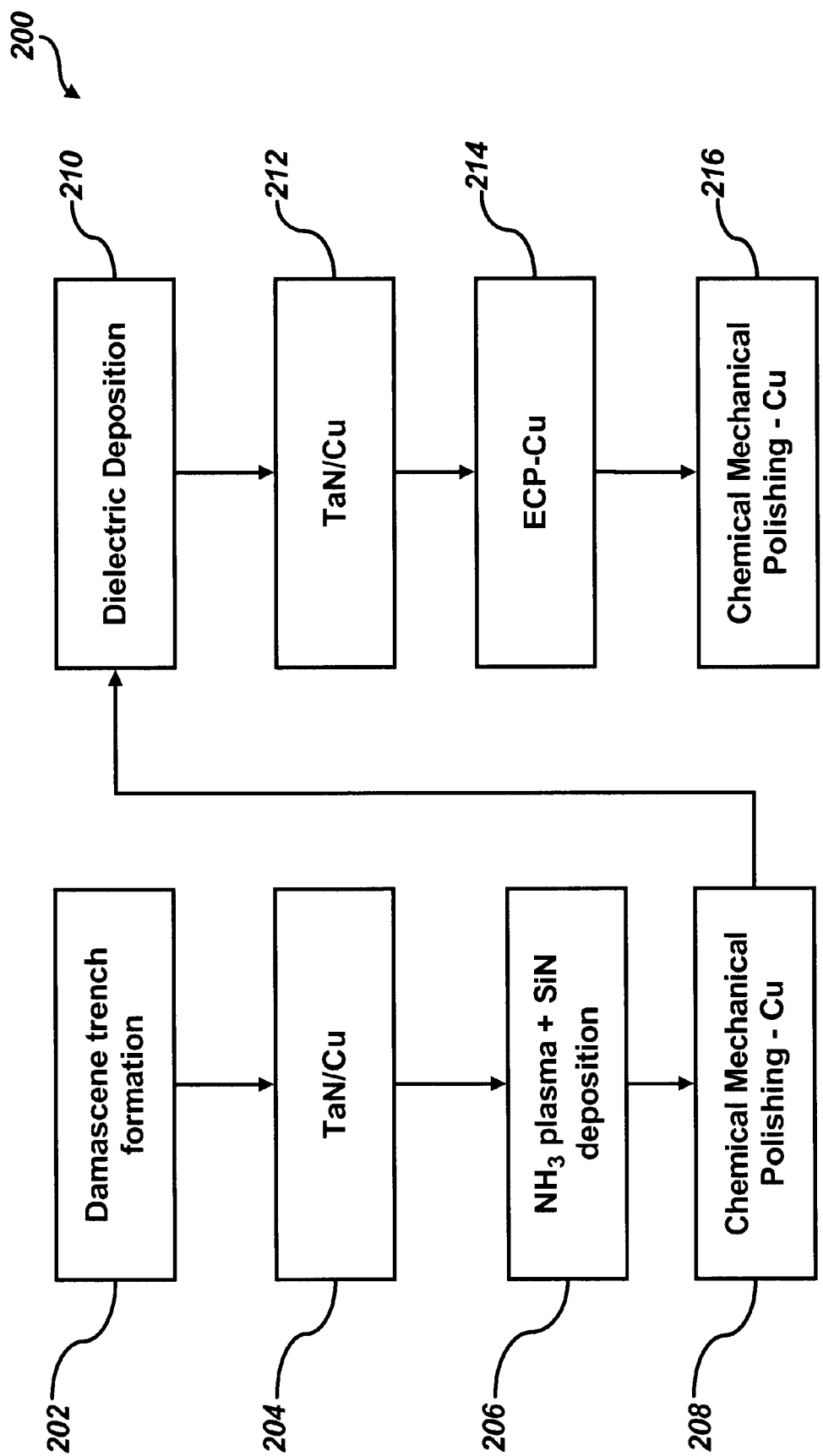
FIG. 11 illustrates a flow chart of operations illustrating semiconductor fabrication operations that may be followed to form a MIM device on a copper damascene, in accordance with an alternative preferred embodiment of the present invention.

FIG. 11 illustrates a flow chart 200 of operations illustrating semiconductor fabrication operations that may be followed to form a MIM device on a copper damascene, in accordance with an alternative preferred embodiment of the present invention. As depicted at block 202, a damascene trench formation can be configured upon a substrate followed, as described at block 204, by the formation of a TaN layer and a copper layer upon the TaN layer. As indicated next at block 206, a layer treated with NH3 plasma and SiN can then be deposited upon the copper layer, which was previously deposited as illustrated at block 204. A CMP operation can then be performed upon the copper layer, followed, as described at block 210, by the deposition of a dielectric layer. Thereafter, as indicated at block 212, a subsequent TaN layer can be formed followed by the formation of another copper layer. Next, as indicated at block 214, an ECP operation can be performed followed thereafter, as depicted at block 216, by another CMP operation.

The present invention thus generally discloses a method and apparatus for forming a metal-insulator-metal structure on a copper damascene, including a semiconductor device thereof. A copper layer may be initially deposited upon a substrate to form a copper damascene, wherein the copper layer forms a metal layer of a metal-insulator-structure. A barrier layer may then be formed upon the substrate following deposition of the copper layer upon the substrate. Thereafter, the copper layer can be polished utilizing chemical mechanical polishing (CMP) to provide enhanced uniformity of the copper layer, thereby producing a well-controlled metal-insulator-metal structure upon the substrate.

The barrier layer formed upon the substrate following deposition of the copper layer may be configured as an in-situ metal barrier. Such an in-situ metal barrier layer may be formed, for example, from tantalum nitride (TaN). The barrier layer may alternatively be configured as a dielectric barrier configured, for example, from $NH_3$ plasma in combination with SiN. The method and apparatus, including a semiconductor device thereof, permit the avoidance of copper oxidation following copper deposition and chemical mechanical polishing (CMP) of the copper layer. Additionally, as a result of implementing the method and apparatus described herein, a much more uniform dielectric layer can be formed on a first metal layer of a MIM, thereby resulting in a well-controlled MIM structure.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for forming a metal-insulator-metal structure on a copper damascene, said method comprising the steps of:

forming a damascene trench upon a substrate and a first TaN layer therein;

depositing a copper layer upon a substrate as a copper damascene, wherein said copper layer forms a metal layer of a metal-insulator-structure;

depositing $NH_3$ plasma and SiN upon said substrate following deposition of said copper layer upon said substrate; and polishing said copper layer utilizing chemical mechanical polishing (CMP) to provide a metal-insulator-metal structure upon said substrate.

2. The method of claim 1 wherein the step of forming a barrier layer upon said substrate following deposition of said copper layer upon said substrate, further comprises the step of forming a barrier layer upon said substrate following deposition of said copper layer upon said substrate, wherein said barrier layer comprises an in-situ metal barrier.

3. The method of claim 2 further comprising the step of configuring said in-situ metal barrier from tantalum nitride (TaN).

4. The method of claim 1 wherein the step of forming a barrier layer upon said substrate following deposition of said copper layer upon said substrate, further comprises the step of: forming a barrier layer upon said substrate following deposition of said copper layer upon said substrate, wherein said barrier layer comprises a dielectric barrier.

5. The method of claim 4 further comprising the step of configuring said dielectric barrier from $NH_3$ plasma in combination with SiN.

6. The method of claim 1 further comprising the steps of:

plating said copper layer formed upon said second tantalum nitrile (TaN) layer, wherein said copper layer is plated utilizing electrochemical plating (ECP); and polishing said copper layer formed upon said second tantalum nitride (TaN) layer following plating of said copper layer, wherein polishing comprises CMP.

7. The method of claim 6 further comprising the steps of:

forming a first tantalum nitride (TaN) layer following a formation of said damascene trench formation upon said substrate;

forming said copper layer upon said tantalum nitride (TaN); and thereafter forming a second tantalum nitride (TaN) layer upon said copper layer, wherein said second tantalum nitride (TaN) layer is formed upon said copper layer.

8. The method of claim 7 further comprising the step of:

polishing said copper layer utilizing CMP following formation of said second tantalum nitride (TaN) layer upon said copper layer; and depositing a dielectric layer upon said substrate following polishing of said copper layer.

9. The method of claim 8 further comprising the steps of:

forming a third tantalum nitride (TaN) layer, wherein said third tantalum nitride (TaN) layer is formed upon said substrate following deposition of said dielectric layer upon said substrate;

thereafter depositing a copper layer upon said third tantalum nitride (TaN) layer; and polishing said copper layer utilizing CMP following deposition of said copper layer upon said third tantalum nitride (TaN) layer.

10. The method of claim 1 further comprising the steps of:

forming a second tantalum nitride (TaN) layer upon substrate following a deposition of said dielectric layer; and thereafter forming a copper layer upon said second tantalum nitride (TaN) layer.

\* \* \* \* \*